United States Patent [19]

Levy

[11] Patent Number: 4,868,093

[45] Date of Patent: Sep. 19, 1989

[54] DEVICE FABRICATION BY X-RAY LITHOGRAPHY UTILIZING STABLE BORON NITRIDE MASK

[75] Inventor: Roland A. Levy, Berkeley Heights, N.J.

[73] Assignee: American Telephone and Telegraph Company, AT&T Bell Laboratories, Murray Hill, N.J.

[21] Appl. No.: 45,907

[22] Filed: May 1, 1987

[51] Int. Cl.$^4$ ............................ G03F 9/00; G21K 5/00
[52] U.S. Cl. ................................. 430/311; 430/966; 430/967; 430/5; 428/698; 428/699; 428/704; 378/35; 378/34; 427/160; 427/372.2
[58] Field of Search ............. 65/117; 148/128; 427/8, 427/160, 255.2, 372.2; 378/34, 35; 430/5, 311, 324, 966, 967; 428/698, 699, 704

[56] References Cited

U.S. PATENT DOCUMENTS

| | | | |
|---|---|---|---|
| 4,096,297 | 6/1978 | Pappis et al. | 428/698 |
| 4,171,489 | 10/1979 | Adams et al. | 250/510 |
| 4,301,237 | 11/1981 | Burns | 430/327 |
| 4,436,797 | 3/1984 | Brady et al. | 430/5 |
| 4,522,842 | 6/1985 | Levinstein et al. | 427/8 |
| 4,539,278 | 9/1985 | Williams et al. | 430/5 |
| 4,565,741 | 1/1986 | Morimoto et al. | 428/698 |
| 4,565,747 | 1/1986 | Nakea et al. | 428/698 |
| 4,604,292 | 8/1986 | Evans et al. | 427/39 |
| 4,608,268 | 8/1986 | Shimkunas | 427/8 |
| 4,668,336 | 5/1987 | Shimkunas | 378/35 |
| 4,677,042 | 6/1987 | Kato et al. | 428/698 |
| 4,680,243 | 7/1987 | Skimkunas et al. | 430/313 |
| 4,690,841 | 9/1987 | Tanji et al. | 428/704 |

OTHER PUBLICATIONS

A. C. Adams and C. D. Capio, "The Chemical Deposition of Boron-Nitrogen Films", J. Electrochemical Society, 127, (1980), pp. 399-405.

Journal Vacuum Science Technology B, vol. 5(1), Jan.-/Feb. 1987, "Radiation Damage Effects in Boron Nitride Mask Membranes Subjected to X-Ray Exposures" by W. A. Johnson et al., pp. 257-261.

Primary Examiner—Jose G. Dees
Assistant Examiner—Donald J. Loney
Attorney, Agent, or Firm—David I. Caplan

[57] ABSTRACT

A hydrogen-free boron-containing membrane in tension exhibits advantageous properties for use as a mask in X-ray lithography.

20 Claims, 1 Drawing Sheet

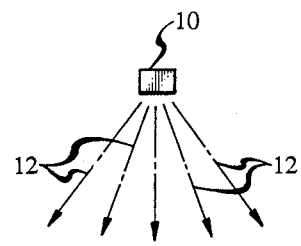
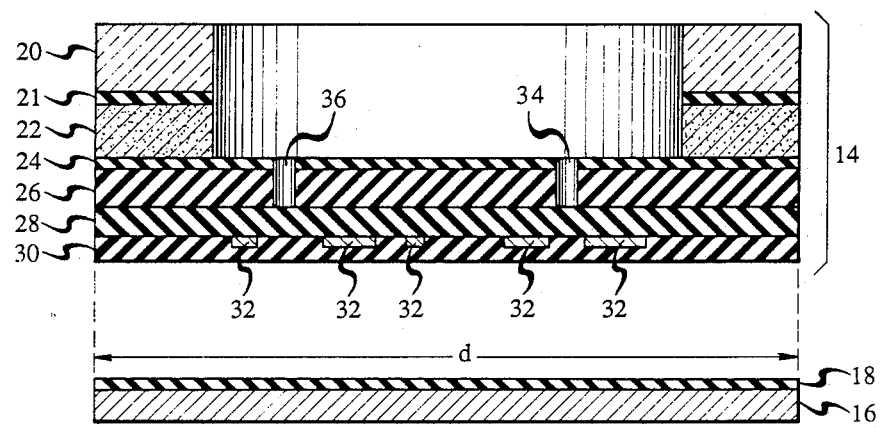

DEVICE FABRICATION BY X-RAY LITHOGRAPHY UTILIZING STABLE BORON NITRIDE MASK

BACKGROUND OF THE INVENTION

This invention relates to the fabrications of microminiature devices and, more particularly, to the manufacture of such devices utilizing the technology known as X-ray lithography.

X-ray lithography is a promising technology being actively explored for the manufacture of microminiature devices such as very-large-scale integratedcircuit devices with submicron feature sizes. In this technology, a resist-coated workpiece is exposed to X-rays via a mask that is interposed between a source of X-rays and the workpiece.

The mask is a key component of X-ray technology and is thus the subject of extensive development. Such a mask comprises an X-ray transparent membrane having an X-ray-opaque device pattern defined thereon.

It is critical that the mask membrane exhibit a high degree of dimensional stability. Further, to facilitate mask-to-workpiece alignment, it is advantageous that the mask membrane be optically transparent.

Various materials from which to make the X-ray mask membrane have been suggested. One such promising material is amorphous hydrogenated boron nitride which exhibits excellent X-ray transmissivity relative to competing materials such as silicon or silicon carbide. It has been shown that boron nitride under tension can be fabricated into large-area mask membranes with high X-ray and optical transparencies, low defect densities and excellent mechanical properties. U.S. Pat. No. 4,522,842 issued to H. J. Levinstein et al describes one such hydrogenated boron nitride mask membrane useful for X-ray lithography.

Recently, the effects on hydrogenated boron nitride of radiation damage caused by long-term and/or high-flux X-ray exposures have been investigated. The results of these investigations are reported in an article entitled "Radiation Damage Effects In Boron Nitride Mask Membranes Subjected to X-ray Exposures," by W. A. Johnson, R. A. Levy, D. J. Resnick, T. E. Saunders and A. W. Yanof, *Journal Vacuum Science Technology* B. Vol. 5, No. 1, January/February 1987, pages 257–261.

As reported in the cited article, radiation exposure can degrade both the optical and mechanical properties, and thus impact on the useful lifetime, of mask membranes made of amorphous hydrogenated boron nitride. Specifically, it is reported in the article that growths will form on exposed boron nitride surfaces irradiated in oxygen-containing ambients; optical transmission of irradiated mask membranes will degrade with cumulative absorbed dose; and, most significantly, the tensile stress of a hydrogenated boron nitride mask membrane will decrease under irradiation and introduce distortions in the device pattern thereon.

In practice, the technology of X-ray lithography is advancing towards higher power X-ray sources and step-and-repeat modes of operation. As this occurs, X-ray mask membranes must tolerance significantly greater radiation doses. But, as indicated, cumulative radiation-induced changes appear to constitute a serious and fundamental wear-out mechanism for masks made of hydrogenated boron nitride. In turn, this threatens to curtail the use of this otherwise attractive material in X-ray lithography.

Accordingly, considerable effectors by workers in the art are being directed at trying to understand the aforestated radiation-induced phenomena and to devise mask membranes for X-ray lithography that do not exhibit the above-described deleterious effects. It was recognized that these efforts if successful would contribute significantly to the realization of better X-ray masks and hence to producing high-quality microminiature devices at a lower cost than heretofore considered possible.

SUMMARY OF THE INVENTION

Applicant has discovered that a stable high-quality mask membrane suitable for fabricating devices by X-ray lithography can be made with a material that comprises hydrogen-free boron nitride. An advantageous such material has a boron-to-nitrogen atomic radio of 1-to-1 and is designated herein as BN. Such BN inherently exhibits a compressive stress condition. Hence, in accordance with applicant's invention, the BN membrane is adjusted to render it tensile within a specified range. One particular way of doing so is to combine a layer of an inherently tensile material such as hydrogen-free $B_3N$ with the BN membrane. By adjusting the thickness of the BN layer, a composite membrane having a stable tensile stress condition in the specified range is achieved.

BRIEF DESCRIPTION OF DRAWING

A complete understanding of the present invention and of the above and other features and advantages thereof may be gained from a consideration of the following detailed description presented herein below in connection with the accompanying single-figure drawing that constitutes a cross-sectional schematic showing, not drawn to scale, of a portion of a specific illustrative X-ray lithographic system that embodies principles of the present invention.

DETAILED DESCRIPTION

Hydrogen-containing (or hydrogenated) boron nitride of the type priorly used to form mask membranes for X-ray lithography exists in practice in different compositional forms. The particularly form of hydrogenated boron nitride that is actually deposited is a function of the specific process parameters (e.g., temperature, pressure, $B_2H_6/NH_3$ ratio, $B_2H_6$ partial pressure, etc.) selected to deposit the material.

One particular form of known boron nitride may be represented as $B_3NH$. This is the specific composition of the amorphous boron nitride investigated and reported upon in the aforeidentified article by Johnson et al.

As indicated earlier above, three radiation-induced effects in an X-ray mask membrane made of a known material such as $B_3NH$ cause both the surface and bulk properties of the membrane to be deleteriously modified. First, the aforementioned growths on the surface of the membrane are believed to result from the availability in the material of excess free boron. Under irradiation, surface dangling bonds of boron are created. In turn, these bonds can react with an oxygen environment to form growths of boric oxide crystallites. These growths can degrade optical alignment signals. Second, dangling boron bonds interior to the surface of the membrane can create midband gap traps (or color centers) which decrease the optical transparency of the membrane. And, third, when a $B_3NH$ membrane is irradiated at sufficiently high doses and dose rates, the bonding configurations of the hydrogen therein are modified such that more of the hydrogen becomes loosely bonded. This in turn causes the membrane to become less tensile and to relax. Such variable stress changes in the membrane can cause large and variable distortions in the mask pattern. These variable changes cannot be tolerated if accurate overlay alignments are to be achieved in a multi-mask fabrication process.

In accordance with the principles of applicant's invention, a mask membrane for X-ray lithography is made of a material comprising hydrogen-free boron nitride. By insuring that no hydrogen exists in the material, the basis for stress variations therein is removed. As a result, the membrane exhibits a highly stable stress characteristic even under prolonged and/or intense exposure to X-rays.

Moreover, in accordance with one specific illustrative embodiment of applicant's invention, the hydrogen-free mask member is advantageously made of stoichiometric boron nitride, that is, boron nitride in which the atomic ratio of boron-to-nitrogen is 1-to-1. Herein, this form of boron nitride is designated BN. Significantly, no excess free boron exists in such a material. Consequently, the aforedescribed problems of radiation-induced crystalline growth and degradation of optical transparency are obviated.

The aforementioned BN material inherently exhibits a compressive stress which generally makes it unsuitable by itself for use as a mask membrane for X-ray lithography. Therefore, in accordance with applicant's invention, various approaches are utilized to impart to the BN membrane a tensile stress in a specified range.

The single-figure drawing shows a portion of a system that includes a specific illustrative embodiment of applicant's inventive principles. In the depicted system, a conventional source 10 emits X-rays that are represented by dash lines 12. The emitted X-rays are directed, as indicated by arrowheads, toward a mask 14. Spaced apart from the mask 14 is a workpiece 16 (e.g., a semiconductor wafer) that includes thereon a layer 18 constituting a standard X-ray-sensitive resist. Illustratively, the workpiece 16 comprises a cylindrical disc or wafer havng a diameter d of about ten centimeters (cm).

The mask 14 comprises a dimensionally stable ring 20 made, for example, of glass. A ring 22 made of silicon is affixed to the ring 20 by any suitable means such as a layer 21 of epoxy cement. In turn, a multi-layer structure comprising layers 24, 26, 28 and 30 is supported by the ring 22.

The mask 14 also includes an X-ray-opaque pattern comprising elements 32. These elements are definitive of a pattern to be transferred into the resist layer 18 on the workpeice 16.

The layer 28 comprises the above-described inherently compressive membrane made of BN. In accordance with a feature of applicant's invention, the layer 28 is in effect tuned or adjusted to achieve a tensile stress condition in a specified range by combining therewith a layer in tension. The layer 26 constitutes this latter layer.

By way of example, the layer 26 comprises hydrogen-free boron nitride of the compositional form $B_3N$. This material is herently highly tensile and, because it contains no hydrogen, its stress condition remains stable even when the layer 26 is intensely irradiated with X-rays for a prolonged period.

Illustratively, the layer 26 made of $B_3N$ exhibits a tensile stress of approximately $1 \times 10^9$ dynes per square centimeter. This stress condition is highly stable and is essentially independent of the thickness of the layer 26. In one embodiment, it was convenient to make the layer 26 about three micrometers ($\mu$m) thick.

The overall composite stress of the bilayer structure comprising the inherently compressive BN layer 28 and the inherently tensile $B_3N$ layer 26 is determined by the thickness of the layer 28 deposited on the layer 26. As the thickness of the layer 28 increases, the composite stress of the structure becomes less tensile. In practice, a composite structure consisting of a BN layer about 0.5 $\mu$m thick combined with a 3-$\mu$m-thick $B_3N$ layer exhibits an overall tensile stress of approximately $0.2 \times 10^9$ dynes per square centimeter. This is within the limits of $0.1$-to-$1 \times 10^9$ dynes per square centimeter, which defines the range of tensile stresses usually desired for such a mask structure.

For a reason that will be apparent later below, it is advantageous to establish a barrier to prevent excess free boron from the $B_3N$ layer 26 from diffusing into the silicon wafer from which the ring 22 is formed. A 300-Angstrom-unit(Å)-thick layer 24 made, for example, of BN (or other barrier material such as $SiO_2$) services as an effective such barrier. Additionally, the layer 24 is effective to passivate the top surface of the layer 26 thereby to prevent the growth of crystallities thereon.

Illustratively, the pattern elements 32 formed on the bottom surface of the BN layer 28 are made of a suitable X-ray-opaque material such as gold. Advantageously, these elements may be covered by the lower 30 which is made of an X-ray-transparent material such as beryllium or a standard monomer or polymer plastic material. The layer 30 protects the elements 32 from damage during handling but may be removed during actual use of the mask in an X-ray lithographic system.

The layer 26 made of $B_3N$ is typically not sufficiently optically transparent after annealing (as specified below) to permit optical alignment between corresponding masks (not shown) formed on the mask and workpiece. To facilitate such alignment by means of an optical microscope (not shown) positioned above the top of the depicted mask, it is advantageous to form plural so-called viewing ports in the layer 26. Two such illustrative ports 34 and 36, each about two millimeters in diameter, are shown in the drawing. As will be evident from the mask fabrication sequence described below, these ports also extend through the BN layer 24.

A specific illustrative fabrication sequence for making the mask 14 will now be described. In the initial step, the layer 24 is formed on one main planar surface of a silicon wafer that is, for example, about ten cm in diameter and approximately 500 $\mu$m thick. (The ring 22 shown in the drawing will subsequently be made by etching this silicon wafer.) Illustratively, the layer 24 is formed in a low-pressure chemical-vapor-deposition (LPCVD) process utilizing diborane ($B_2H_6$) and ammonia ($NH_3$) as constituent gases. Satisfactory deposition occurs in the temperature range of about 450-to-500 degrees Celsius (°C.) and in the pressure range of approximately 0.3-to-1 Torr (T). In one particular process sequence, 475° C. and 0.2 T were selected, together with a flow rate for $NH_3$ of about 3000 standard cubic centimeters per minute (sccm) and a flow rate for $B_2H_6$ (actually 15 percent $B_2H_6$ in nitrogen) of approximately 40 sccm. As a result, a 300-Å-thick hydrogen-containing BN layer was deposited on the surface of the silicon wafer at a rate of about 5-to-10 Å per minute.

Alternatively, the layer 24 can be formed by utilizing a borane triethylamine complex $(C_2H_5)_3 N \cdot BH_3$ and $NH_3$, or a borane diethylamine complete $(C_2H_5)_2 NH \cdot BH_3N$ and $NH_3$, as constituents. Illustrative LPCVD process parameters in this case include: 375°-to-850°C. (e.g., 800° C.), 200 mT-to-1 T (e.g. 0.5 T), a flow rate for $NH_3$ of about 250 sccm and a flow rate of approximately 500 sccm for nitrogen bubbled through either of the aforespecified complexes, with the bubbler heated to about 120° C. This process yields a deposition rate of about 10-to-20 Å per minute. For such depositions carried out at about 800° C., the resulting layer of BN is typically hydrogen-free.

Subsequently, the layer 26 is deposited on the surface of the layer 24 in an LPCVD process. Illustratively, this is done at 375° C. and at 0.2 T, with a $B_2H_6$ flow rate of about 50 sccm and an $NH_3$ flow rate of approximately 50 sccm. A 3-um-thick layer of hydrogen-containing $B_3N$ can be thereby deposited at a rate of about 10-to-20 Å per minute.

Significantly, the above-specified procedure produces in practice a hillock-free layer 26 made of hydrogen-containing $B_3N$. Such a hillock-free layer 26 obviates the need to add thereto a planarizing layer made, for example, of polyimide which itself might introduce distortions during X-ray exposure.

The hydrogen-containing $B_3N$ layer 26 can also be deposited by utilizing the aforementioned borane triethylamine complex and $NH_3$, or the borane diethylamine complex and $NH_3$. Illustratively, this is done at about 800° C. and 0.5 T by stopping the flow of $NH_3$ or adjusting it to produce the desired stoichiometry.

Next, the layer 28 is deposited on the surface of the layer 26 by following either of the process sequences set forth above for making the layer 24. A 5000-Å-thick layer 28 is thereby formed.

Advantageously, the layers 24, 26 and 28 are each formed by utilizing the aforementioned borane complex and $NH_3$ constituents. In practice, the use of such a common chemistry simplifies the deposition of these layers.

At that point, the silicon wafer with the three aforedescribed layers 24, 26 and 28 thereon is annealed at a relatively high temperature to remove all hydrogen therefrom. By way of example, this is carried out a temperature greater than 1075° C. (e.g. 1100° C.) for about one hour in a vacuum or in an inert ambient such as argon or nitrogen.

High-temperature annealing of the aforementioned layers to remove hydrogen therefrom can also be achieved in other ways. Illustratively, rapid thermal-annealing (RTA), laser annealing or charged-particle-beam annealing technique can be utilized to remove hydrogen from the layers 24, 26 and 28.

A layer of X-ray-opaque material is then deposited on the surface of the layer 28. Next, by utilizing standard etching techniques, the interior portion of the aforedescribed silicone wafer is totally removed, thereby leaving only the silicon ring 22 shown in the drawing. The glass ring 20 is then affixed to the silicon ring 22.

The aformentioned etching of the slicon wafer to produce the ring 22 would be made more difficult if boron diffused from the $B_3N$ layer 26 into the wafer during the aforespecified hydrogen-removal step at 1100° C. To prevent such high-temperature diffusion and thus facilitate etching, the layer 24 is interposed between the layer 26 and the wafer to serve as a diffusion barrier to boron, as mentioned earlier above.

Subsequently, the viewing ports 34 and 36 are formed in the layers 24 and 26 by conventional dry or wet etching techniques. Then the X-ray-opaque material is patterned to form the elements 32, and lastly the protective layer 30 is deposited.

As a result of the above-described high-temperature annealing step, the $B_3N$ layer 26, which is initially transparent to light, darkens. This darkening is believed to be due to phase separation of the annealed $B_3N$ structure into a boron-rich phase and a boron nitride phase. Due to its bandgap of approximately 1.5 eV, the boron-rich phase absorbs light and causes the noted darkening of the annealed layer 26.

The aforementioned phase separation provides a basis for selectively etching the layer 26 with respect to overlying or underlying layers made of stoichiometric boron nitride. Illustratively, this etching is carried out by utilizing hot nitric acid. Such selective wet etching can be used in conjunction with standard lithographic techniques to form, for example, the above-specified viewing ports 34 and 36.

In accordance with the principles of applicant's invention, techniques other than the particular illustrative one described above and depicted in the drawing are feasible for adjusting the inherently compressive stress of the BN layer 28 to be tensile within a specified range. Thus, for example, a stressinducing constituent such as silicon can be selectively added to the BN layer 28 to adjust its stress condition to a specified value. In that case, the layer 28 rests directly on the silicon ring 22 and layers 24 and 26 shown in the drawing are not needed.

Further, an X-ray mask membrane utilizing the BN layer 28 without the layers 24 and 26 can be adjusted in other ways to exhibit a specified tensile stress. For example, the layer 28 can be mechanically stretched to impart tension thereto. Illustratively, this can be done by positioning a weighted ring within the cavity defined by the rings 20 and 22. Such a weighted ring in contact with peripheral portions of the top surface of the layer 28 is effective to establish the interior portion of the layer 28 in tension.

Additionally, the stress of a mask membrane utilizing the BN layer 28 without the layers 24 and 26 can be adjusted in still other ways. For example, the supporting ring 22 can be made of a material such as quartz that exhibits a lower linear coefficient of expansion than does the material of the layer 28 adhered directly thereto. As a result of cooling during fabrication of such a mask structure, the desired tensile stress condition can thereby be imparted to the BN layer 28.

Applicant's discovery that a hydrogen-free boron nitride membrane exhibits a highly stable stress condition under irradiation provides a basis for constructing yet other mask membranes suitable for X-ray lithography. By way of example, a hydrogen-free layer of $B_3N$ with a thin diffusion barrier made, for example, of BN between the $B_3N$ layer and the supporting silicon ring 22 can serve as such a membrane. (As mentioned earlier above, $B_3N$ by itself exhibits a tensile stress of about $1 \times 10^9$ dynes per square centimeter). To facilitate optical alignment with such a membrane, viewing ports are advantageously included in the $B_3N$ and BN layers and alignment marks are formed on the bottom surface of the $B_3N$ layer to respectively bridge the openings deined by these ports. These bridging marks are then visible through the viewing ports and can be respectively aligned with coresponding marks formed on an associated wafer.

By utilizing laser or charge-departicle-beam techniques, it is also feasible to anneal only localized portions of a tensile hydrogen-containing $B_3N$ layer. In that way, only the portions of that layer to be subjected to X-rays would be annealed to remove hydrogen therefrom. Only these localized portions would be thereby darkened. Unannealed portions of the layer would remain transparent to light and usable for optical alignment purposes.

Finally, it is to be understood that the above-described structures and processing techniques are only illustrative of the principles of the present invention. In accordance with these principles, numerous modifications and alternatives may be devised by those skilled in the art without departing from the spirit and scope of the invention. Thus, for example, applicant has also determined that other hydrogen-free boron-containing materials are suitable for forming stable mask membranes for use in X-ray lithography. Hydrogen-free boron carbide is one such illustrative other material. Additionally, hydrogen-free boron is attractive for use as a mask membrane. Substantially pure boron is highly transparent to X-rays, inherently tensile, and extremely strong (exhibiting a Young's modulus that is higher by a factor of ten than that for $B_3N$).

In a mask comprising a hydrogen-free boron membrane, it is advantageous to include a diffusion barrier layer on one major surface of the boron membrane and a passivating layer on the other major surface thereof. BN, for example, is a suitable material for forming the barrier and passivating layers. Also, in such a mask comprising a hydrogen-free boron membrane, it is advantageous to include viewing ports, of the type described earlier above, to facilitate optical alignment.

What is claimed is:

1. A process for fabricating devices by X-ray lithography wherein a mask member having an X-ray-opaque device pattern thereon is aligned with respect to a device workpiece and is irradiated with X-rays, the mask member comprising a hydrogen-free boron-containing membrane in tension.

2. A process as in claim 1 wherein said mask member comprises a hydrogen-free BN membrane and means for maintaining said membrane in tension.

3. A process as in claim 2 wherein said maintaining means comprises a layer of hydrogen-free $B_3N$ deposited on said BN membrane.

4. A process as in claim 3 wherein a barrier layer to diffusion of boron is deposited on said layer of $B_3N$.

5. A process as in claim 4 wherein ports are formed in said diffusion barrier layer and in said layer of $B_3N$ for viewing corresponding alignment marks formed on said mask member and said workpiece.

6. A process as in claim 22 wherein said maintaining means comprises a stress-inducing constituent added to the material of said BN membrane.

7. A process as in claim 6 wherein said constituent comprises silicon.

8. A process as in claim 2 wherein said maintaining means comprises a ring member in contact with peripheral portions of said BN membrane for imparting tensile forces to said membrane.

9. A process as in claim 1 wherein said mask member comprises a hydrogen-free $B_3N$ membrane.

10. A process as in claim 9 wherein a barrier layer to diffusion of boron is deposited on said $B_3N$ membrane.

11. A process as in claim 10 wherein ports are formed in said diffusion barrier layer and in said $B_3N$ membrane for viewing corresponding alignment marks formed on said mask structure and said workpiece.

12. A process as in claim 1 wherein said mask member comprises a hydrogen-free boron membrane.

13. A device fabrication method comprising
forming an X-ray-opaque device pattern on a portion of a member in tension that contains boron and hydrogen, said portion being adapted to be irradiated with X-rays,
annealing only said portion of said member to remove hydrogen therefrom, and
irradiating thereafter said portion with X-rays to project said pattern onto a device workpiece that is aligned with respect to said member.

14. A method as in claim 13 wherein optical alignment between said device workpiece and said member is achieved by utilizing an unannealed portion of said member.

15. A mask structure for use in fabricating devices by X-ray lithography, said structure comprising
an X-ray-transparent mask comprising a hydrogen-free boron-containing membrane in tension,
and an X-ray-opaque device pattern formed on said membrane.

16. A structure as in claim 14 wherein said mask comprises a hydrogen-free boron nitride membrane in tension.

17. A structure for use in a mask for fabricating device by X-ray lithography comprising:
a relatively thin membrane comprising a hydrogen-free boroncontaining member in tension,
and a relatively thick member supporting peripheral portions of said membrane.

18. The structure recited in claim 17 wherein said membrane comprises a hydrogen-free boron nitride member in tension.

19. In combination in a system designed to define device features by X-ray lithography, said system comprising
an X-ray-transparent mask having X-ray-opaque device features formed thereon, said mask comprising a hydrogen-free boron-containing membrane in tension,
a device workpiece aligned with respect to said mask, and
means for irradiating said mask with X-rays to cause said device features to be defined on said workpiece.

20. A combination as in claim 19 wherein said membrane comprises a hydrogen-free boron nitride member.

* * * * *

UNITED STATES PATENT AND TRADEMARK OFFICE
CERTIFICATE OF CORRECTION

PATENT NO.   : 4,868,093
DATED        : September 19, 1989
INVENTOR(S)  : R. A. Levy It is certified that error appears in the above-identified patent and that said Letters Patent is hereby corrected as shown below:

In the claims:

Column 7, line 57, "claim 22" should read --claim 2--.

In the specification:

Column 1, line 7, "fabrications" should read --fabrication--.
    Column 2, line 3, "effectors" should read --efforts--;
             line 20, "radio" should read --ratio--;
             line 46, "particularly" should read --particular--.
    Column 3, line 28, "crystalline" should read --crystallite--;
             line 67, "herently" should read --inherently--.
    Column 4, line 30, "crystallities" should read
             --crystallites--;
             line 34, "lower" should read "layer--;
             line 64, "0.3-to-1" should read --0.2-to-1--.
    Column 5, line 61, "silicone" should read --silicon--.

Signed and Sealed this

Second Day of October, 1990

Attest:

HARRY F. MANBECK, JR.

Attesting Officer      Commissioner of Patents and Trademarks